United States Patent
Chang (10) Patent No.: US 8,655,616 B2
(45) Date of Patent: Feb. 18, 2014

(54) SYSTEM FOR TESTING ILLUMINATING ELEMENTS AND METHOD FOR TESTING ILLUMINATING ELEMENTS

(75) Inventor: Pei-Ming Chang, Taipei (TW)

(73) Assignee: Primax Electronics Ltd., Taipei (TW)

( * ) Notice: Subject to any disclaimer, the term of this patent is extended or adjusted under 35 U.S.C. 154(b) by 298 days.

(21) Appl. No.: 13/163,098

(22) Filed: Jun. 17, 2011

(65) Prior Publication Data

US 2012/0265467 A1 Oct. 18, 2012

(30) Foreign Application Priority Data

Apr. 15, 2011 (TW) .............................. 100113133 A (51) Int. Cl.
*G06F 19/00* (2011.01)

(52) U.S. Cl.
USPC .............................. 702/82; 356/394; 356/229

(58) Field of Classification Search
CPC ........... G06F 19/00; F21K 9/54; G01N 33/66; G01J 1/32
USPC ..................................... 702/82; 356/229, 394
See application file for complete search history.

(56) References Cited

U.S. PATENT DOCUMENTS

| | | | |
|---|---|---|---|
| 3,315,078 A * | 4/1967 | Schellekens et al. | 250/205 |
| 6,119,250 A * | 9/2000 | Nishimura et al. | 714/718 |
| 2007/0113124 A1* | 5/2007 | Chang et al. | 714/724 |
| 2009/0078853 A1* | 3/2009 | Lin | 250/205 |

* cited by examiner

*Primary Examiner* — John E Breene
*Assistant Examiner* — Ruihua Zhang
(74) *Attorney, Agent, or Firm* — Evan R. Witt; Kirton McConkie (57) ABSTRACT

The present invention discloses a system for testing illuminating elements and a method for testing illuminating elements, wherein the method includes the following steps. Firstly, an illuminating element and an unilluminated area on a circuit board are covered respectively. A reference voltage is obtained according to a brightness of the unilluminated area and a testing voltage is obtained according to a brightness of the illuminating element being driven. Afterwards, whether the illuminating element passes a testing process or not is judged from the reference voltage and the testing voltage.

7 Claims, 10 Drawing Sheets

SYSTEM FOR TESTING ILLUMINATING ELEMENTS AND METHOD FOR TESTING ILLUMINATING ELEMENTS

FIELD OF THE INVENTION

The present invention generally relates to a testing system and a testing method, and more particularly to a system for testing illuminating elements and a method for testing illuminating elements.

BACKGROUND OF THE INVENTION

Illuminating elements are applied to various electronic products as indicating lights of the electronic products due to capable of generating light. The most common one of the illuminating elements is the light emitting diode (LED), and the LED is widely used increasingly due to the LED has advantages of small size and low power consuming.

In general, the LED is disposed on a circuit board and connected with a circuit on the circuit board, so as to generate light, wherein the circuit on the circuit board may be designed as required, and thus the LED may generate light with different colors or with different frequency. In another word, the circuit board is disposed on various electronic products after the LED is disposed on the circuit board.

A test is necessary for ensuring whether the LED is able to be operated well or not after a manufacture of the LED is finished. Accordingly, it is understood that the LED must be disposed on the circuit board during being tested; otherwise, the LED must be connected with an additional driving circuit. In general, a tester drives the LED manually to let the LED generate light during a conventional LED testing process. At the same time, the tester judges whether the LED is operating normally or not by observing whether the LED is lighting normally or not with unaided eyes. However, the eyes of the tester may be prone to glare due to staring the light of the LED for a long time after the tester have done the test for a long time. Therefore, it is likely to cause a misjudgment due to judging a lightless LED as a lighting LED, and thus the conventional LED testing process is not accurate enough. In addition, the above mentioned testing process is slower and an accuracy thereof is unable to meet a requirement of a modern factory as well. Therefore, it is necessary to provide a system for automatically testing illuminating elements and a method for automatically testing illuminating elements.

SUMMARY OF THE INVENTION

The present invention is directed to a system for automatically testing illuminating elements and a method for automatically testing illuminating elements.

The present invention is further directed to a system for testing illuminating elements and a method for testing illuminating elements, so as to reduce a probability of misjudgment.

In a preferred embodiment, the present invention provides a system for testing illuminating elements capable of testing an illuminating element disposed on an circuit board, wherein the system for testing illuminating elements comprises:
a computer host capable of outputting a testing result of the illuminating element; and
a testing socket connected with the computer host, and capable of testing the illuminating element, wherein the testing socket comprises:
a first mask capable of covering an unilluminated area on the circuit board;
a first photosensitive circuit having a first photosensitive element, wherein the first photosensitive element is located within the first mask, and the first photosensitive circuit is capable of generating a reference voltage according to a brightness of the unilluminated area detected by the first photosensitive element;
a second mask capable of covering the illuminating element;
a second photosensitive circuit having a second photosensitive element, wherein the second photosensitive element is located within the second mask, and the second photosensitive circuit is capable of generating a testing voltage according to a brightness of the illuminating element detected by the second photosensitive element; and
a judgment circuit connected with the first photosensitive circuit, the second photosensitive circuit and the computer host respectively, and capable of determining whether the illuminating element passes a testing process or not by judging whether the testing voltage is larger than the reference voltage or not.

In a preferred embodiment, the judgment circuit comprises:
a comparing unit connected with the first photosensitive circuit and the second photosensitive circuit, and capable of comparing the testing voltage and the reference voltage, wherein the comparing unit outputs a high logic level signal when the first photosensitive circuit and the second photosensitive circuit connect with the comparing unit as a positive logic connection and the testing voltage obtained according to the illuminating element being driven is larger than the reference voltage, while the comparing unit outputs a low logic level signal when the testing voltage is not larger than the reference voltage; or the comparing unit outputs the high logic level signal when the first photosensitive circuit and the second photosensitive circuit connect with the comparing unit as a negative logic connection and the testing voltage is smaller than the reference voltage, while the comparing unit outputs the low logic level signal when the testing voltage is not smaller than the reference voltage; and
a controlling unit connected with the comparing unit and the computer host, capable of receiving the high logic level signal or receiving the low logic level signal, and capable of generating a testing failure signal to the computer host when receiving the low logic level signal.

In a preferred embodiment, the illuminating element is turned off and detected by the second photosensitive circuit after the controlling unit receives the high logic level signal, so as to obtain another testing voltage, and then the comparing unit judges whether the illuminating element passes a test process or not according to the another testing voltage and the reference voltage; wherein the comparing unit outputs another high logic level signal when the first photosensitive circuit and the second photosensitive circuit connect with the comparing unit as the positive logic connection and the another testing voltage is not larger than the reference voltage, and thus the controlling unit generates a testing pass signal to the computer host according to the high logic level signal and the another logic level signal, while the comparing unit outputs the low logic level signal when the another testing voltage is larger than the reference voltage; or the comparing unit outputs the another high logic level signal when the first photosensitive circuit and the second photosensitive circuit connect with the comparing unit as the negative logic connection and the another testing voltage is not smaller than the reference voltage, and thus the controlling unit generates the testing pass signal to the computer host according to the high logic level signal and the another logic level signal, while the comparing unit outputs the low logic level signal when the another testing voltage is smaller than the reference voltage.

In a preferred embodiment, the judgment circuit comprises a comparing unit connected with the first photosensitive circuit and the second photosensitive circuit, and capable of comparing the testing voltage and the reference voltage; the comparing unit outputs a high logic level signal to the computer host when the first photosensitive circuit and the second photosensitive circuit connect with the comparing unit as a positive logic connection and the testing voltage is larger than the reference voltage, while the comparing unit outputs a low logic level signal when the testing voltage is not larger than the reference voltage; or the comparing unit outputs the high logic level signal to the computer host when the first photosensitive circuit and the second photosensitive circuit connect with the comparing unit as a negative logic connection and the testing voltage is smaller than the reference voltage, while the comparing unit outputs the low logic level signal to the computer host when the testing voltage is not smaller than the reference voltage.

In a preferred embodiment, the illuminating element is turned off and detected by the second photosensitive circuit after the computer host receives the high logic level signal, so as to obtain another testing voltage, and then the comparing unit judges whether the illuminating element passes a testing process or not according to the another testing voltage and the reference voltage; wherein the comparing unit outputs another high logic level signal to the computer host when the first photosensitive circuit and the second photosensitive circuit connect with the comparing unit as the positive logic connection and the another testing voltage is not larger than the reference voltage, while the comparing unit outputs the low logic level signal when the another testing voltage is larger than the reference voltage; or the comparing unit outputs the another high logic level signal to the computer host when the first photosensitive circuit and the second photosensitive circuit connect with the comparing unit as the negative logic connection and the another testing voltage is not smaller than the reference voltage, while the comparing unit outputs the low logic level signal when the another testing voltage is smaller than the reference voltage.

In a preferred embodiment, the computer host comprises a testing program capable of generating the testing pass signal when the computer host receives the high logic level signal and the another high logic level signal, or generating the testing failure signal when the computer host receives the low logic level signal.

In a preferred embodiment, the system for testing illuminating elements of the present invention further comprises a computer peripheral device, wherein the computer peripheral device is connected with the computer host, and capable of providing the testing pass signal or the testing failure signal.

In a preferred embodiment, the computer peripheral device is a computer screen capable of displaying the testing pass signal or the testing failure signal, or an audio device capable of prompting the testing pass signal and the testing failure signal with different sounds.

In a preferred embodiment, the testing socket is connected with the computer host via a RS232 interface connection cable or an universal serious bus (USB) interface connection cable, and the first photosensitive element and the second photosensitive element are photosensitive resistors.

In a preferred embodiment, the present invention further provides a method for testing illuminating elements capable of testing an illuminating element disposed on an circuit board, wherein the method for testing illuminating elements comprises:

respectively covering the illuminating element and an unilluminated area on the circuit board, and then obtaining a reference voltage according to a brightness of the unilluminated area and obtaining a testing voltage according to a brightness of the illuminating element being driven; and judging whether the illuminating element passes a testing process or not from the testing voltage and the reference voltage.

In a preferred embodiment, the step of respectively covering the unilluminated area and the illuminating element is using a first mask and a second mask to respectively cover the unilluminated area and the illuminating element, and then the reference voltage is obtained by detecting the brightness of the unilluminated area with a first photosensitive element located within the first mask, and the testing voltage is obtained by detecting the brightness of the illuminating element with a second photosensitive element located within the second mask.

In a preferred embodiment, the illuminating element is turned off when the first photosensitive element and the second photosensitive element are disposed as a positive logic connection and the testing voltage is larger than the reference voltage, while the illuminating element is judged as testing failure when the testing voltage is not larger than the reference voltage; or the illuminating element is turned off when the first photosensitive element and the second photosensitive element are disposed as a negative logic connection and the testing voltage is smaller than the reference voltage, while the illuminating element is judged as testing failure when the testing voltage is not smaller than the reference voltage.

In a preferred embodiment, the method for testing illuminating elements of the present invention further comprises a step of judging whether the illuminating element passes a test process or not according to another testing voltage and the reference voltage when the illuminating element is turned off and detected by the second photosensitive element to obtain the another testing voltage; wherein the illuminating element is judged as testing passed when the first photosensitive element and the second photosensitive element are disposed as the positive logic connection and the another testing voltage is not larger than the reference voltage, while the illuminating element is judged as testing failure when the another testing voltage is larger than the reference voltage; or the illuminating element is judged as testing passed when the first photosensitive element and the second photosensitive element are disposed as the negative logic connection and the another testing voltage is not smaller than the reference voltage, while the illuminating element is judged as testing failure when the another testing voltage is smaller than the reference voltage.

In a preferred embodiment, the method for testing illuminating elements of the present invention further comprises displaying that the test of the illuminating element is passed or the test of the illuminating element is failure with images, or prompting that the test of the illuminating element is passed or the test of the illuminating element is failure by displaying with sounds.

DETAILED DESCRIPTION OF THE PREFERRED EMBODIMENT

Figure 1A:
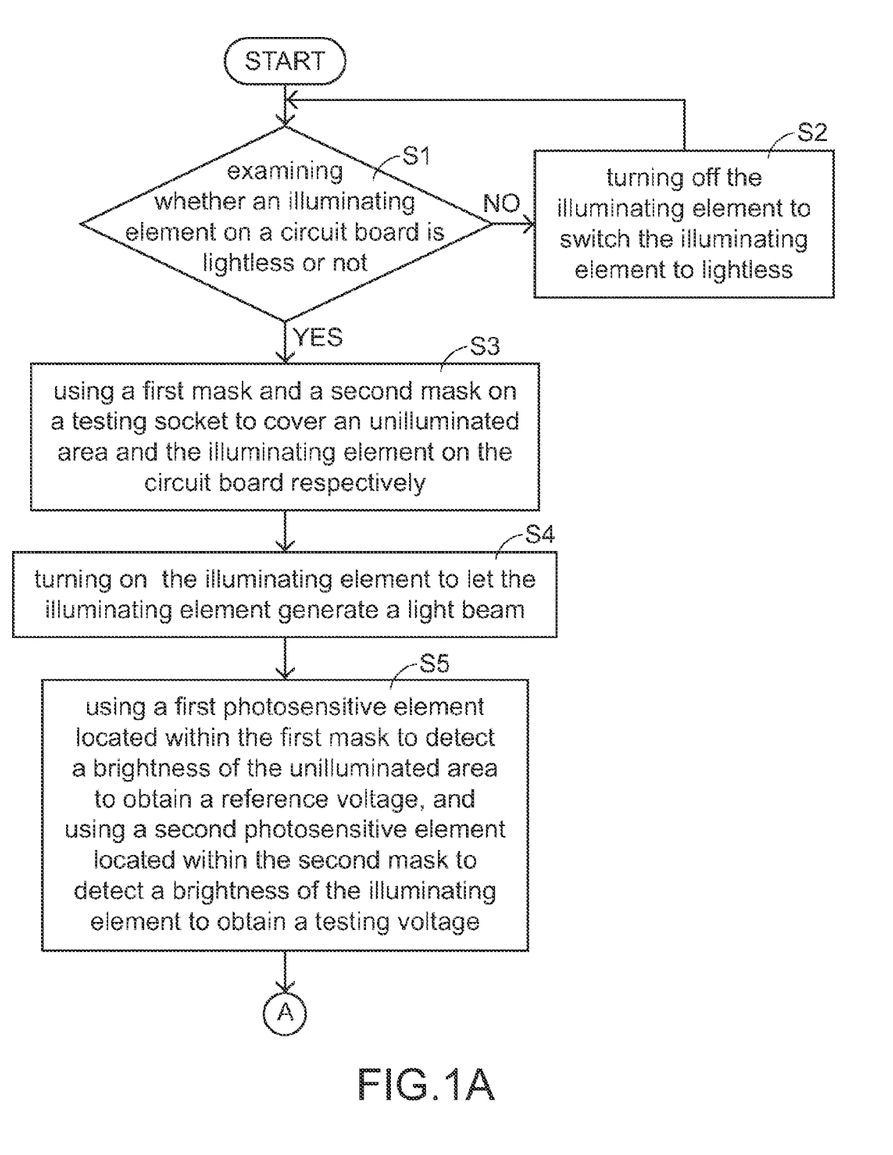
FIG. 1 illustrates a schematic block flow chart of a method for testing illuminating elements according to a first preferred embodiment of the present invention.
Figure 1B:
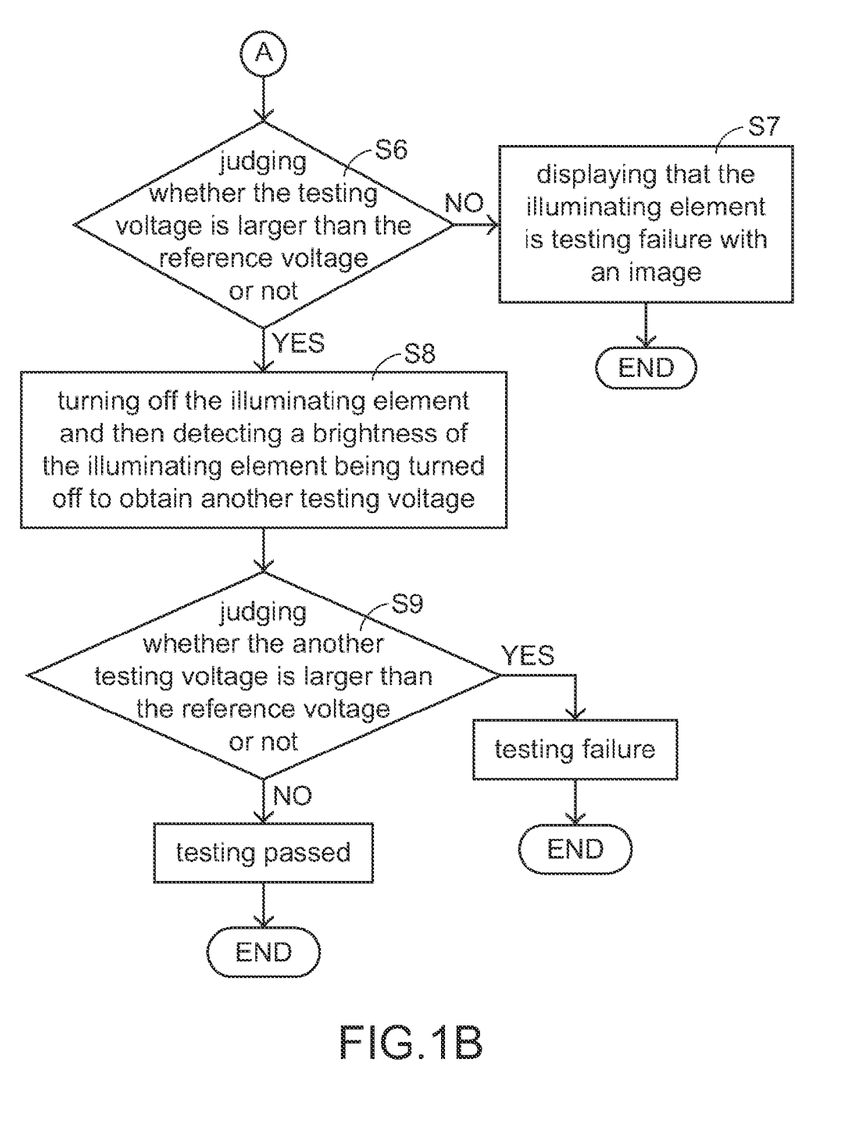

In view of the defects of the defects arts, the present invention provides a system for testing illuminating elements and method for testing illuminating elements. FIG. 1 illustrates a schematic block flow chart of a method for testing illuminating elements according to a first preferred embodiment of the present invention. Referring to FIG. 1, in the present preferred embodiment, the method for testing illuminating elements of the present invention comprises the following steps. The step S1 is examining whether an illuminating element on a circuit board is lightless or not. The step S2 is turning off the illuminating element to switch the illuminating element to lightless. The step S3 is using a first mask and a second mask on a testing socket to cover an unilluminated area and the illuminating element on the circuit board respectively. The step S4 is turning on the illuminating element to let the illuminating element generate a light beam. The step S5 is using a first photosensitive element located within the first mask to detect a brightness of the unilluminated area to obtain a reference voltage, and using a second photosensitive element located within the second mask to detect a brightness of the illuminating element to obtain a testing voltage. The step S6 is judging whether the testing voltage is larger than the reference voltage or not. The step S7 is displaying that the illuminating element is testing failure with an image. The step S8 is turning off the illuminating element and then detecting a brightness of the illuminating element being turned off to obtain another testing voltage. In addition, the step S9 is judging whether the another testing voltage is larger than the reference voltage or not.

The step S2 is processed when the illuminating element is not lightless in the step S1 for ensuring the illuminating element being lightless. After the step S2 is processed, the step S1 is processed again until the illuminating element being lightless. The step S6 is judging whether the reference voltage is larger than the testing voltage or not. The step S7 is processed when the testing voltage is not larger than the reference voltage, and then the test is finished, while the step S8 is processed when the testing voltage is larger than the reference voltage. In the step S9, the illuminating element is judged as testing passed when the another testing voltage is not larger than the reference voltage, while the illuminating element is judged as testing failure when the another testing voltage is larger than the reference voltage.

It should be noted that an internal circuit within the testing socket in the present preferred embodiment is disposed as a positive logic connection, and thus judgments of the step S6 and the step S9 are processed according to whether the testing voltage and the another testing voltage are larger than the reference voltage or not. However, the internal circuits within the testing sockets in other present preferred embodiments may further be disposed as a negative logic connection, and thus the judgments thereof is processed according to whether the testing voltage and the another testing voltage are smaller than the reference voltage or not. Note that a structure of the internal circuit within the testing socket is illustrated later.

Figure 2:
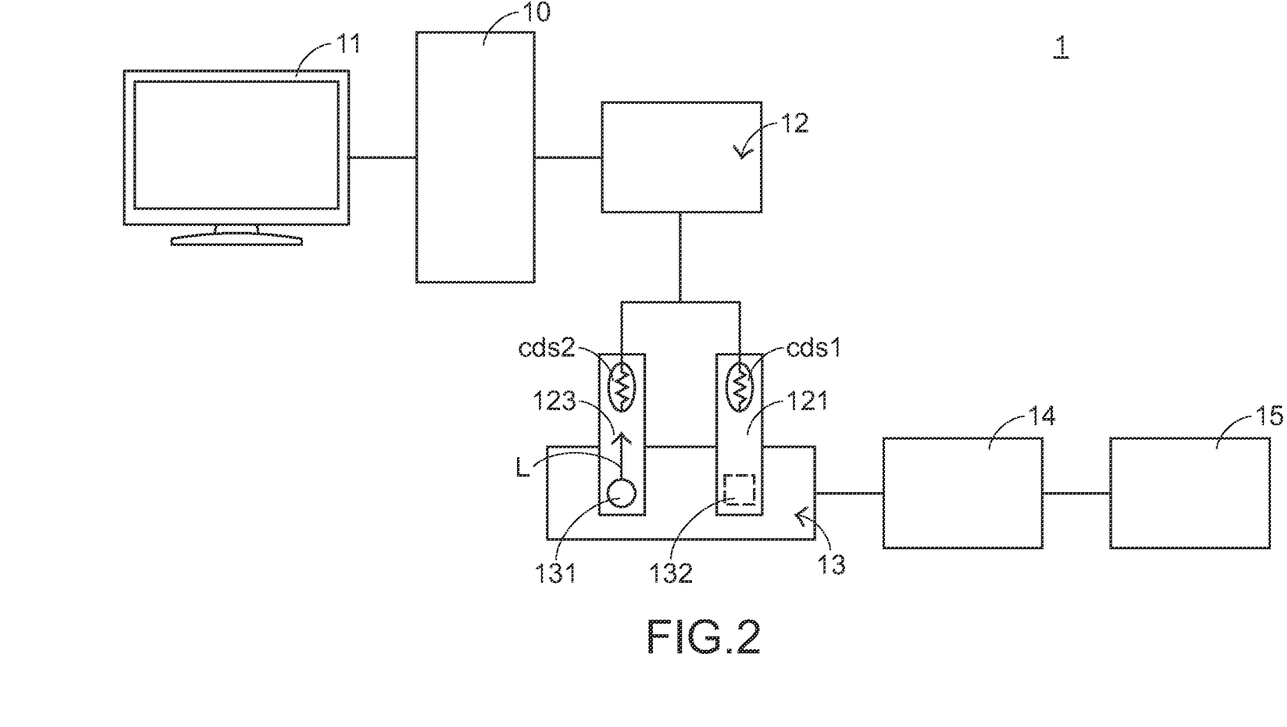
FIG. 2 illustrates a schematic structural view of a system for testing illuminating elements according to the first preferred embodiment of the present invention.
Figure 3:
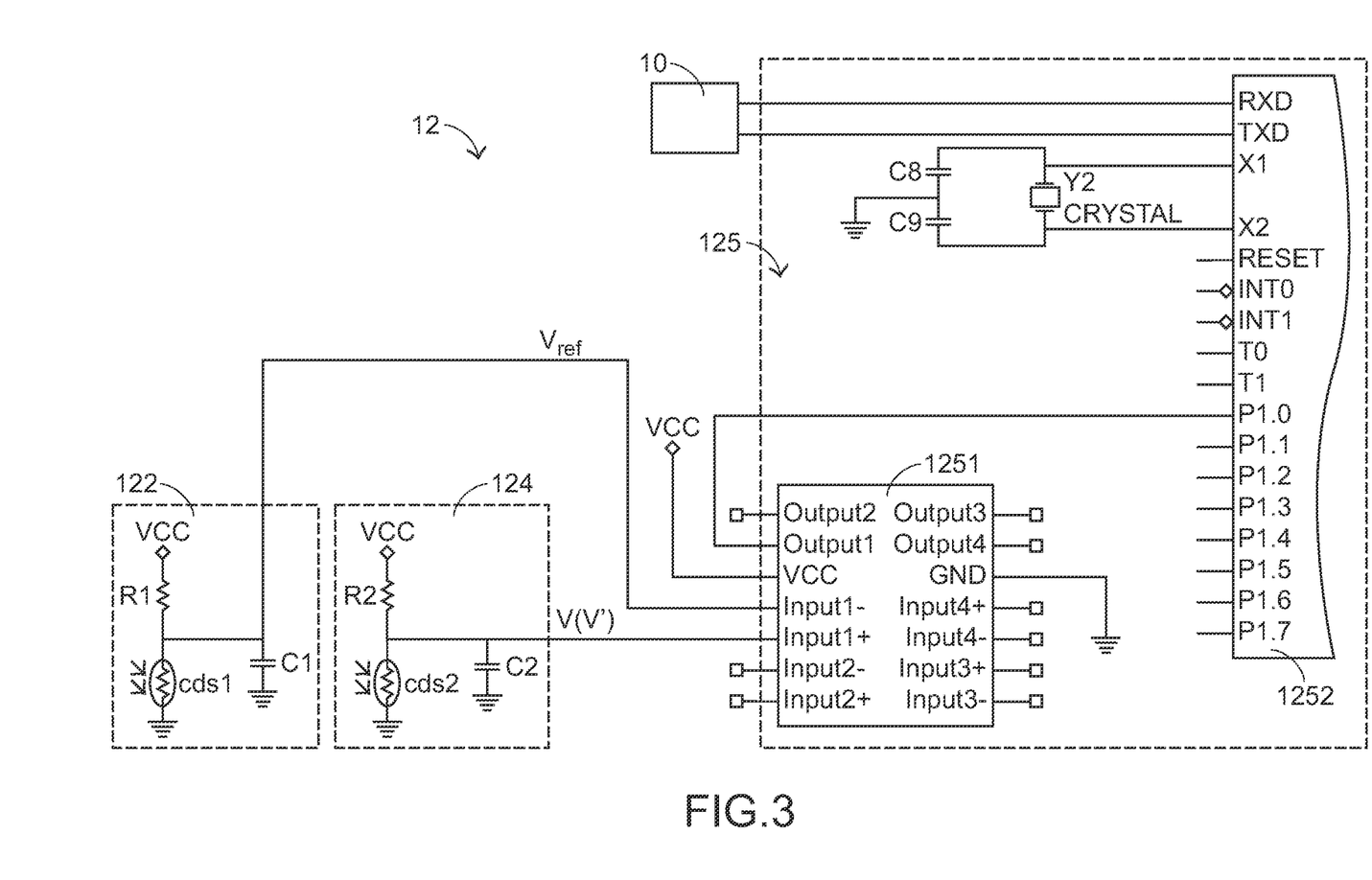
FIG. 3 illustrates a schematic internal circuit diagram of the system for testing illuminating elements according to the first preferred embodiment of the present invention.

A system for testing illuminating elements of the present invention is illustrated herein after. FIG. 2 illustrates a schematic structural view of a system for testing illuminating elements according to the first preferred embodiment of the present invention. FIG. 3 illustrates a schematic internal circuit diagram of the system for testing illuminating elements according to the first preferred embodiment of the present invention. Referring to FIG. 2 and FIG. 3 together, a system 1 for testing illuminating elements comprises a computer host 10, a computer peripheral device 11 and a testing socket 12, and the system 1 for testing illuminating elements is capable of testing an illuminating element 131 on a circuit board 13. In the present preferred embodiment, the illuminating element 131 is a LED. The circuit board 13 is connected with a switch circuit 14, and the switch circuit 14 is connected with a power source 15. The switch circuit 14 is capable of switching on or switching off the illuminating element 131, so that the illuminating element 131 generates a light beam L or is lightless. In addition, the power source 15 is capable of providing electric power to the circuit board 13 and the switch circuit 14.

In the system 1 for testing illuminating elements, the computer host 10 is capable of outputting a testing result of the illuminating element 131. In addition, the computer peripheral device 11 is connected with the computer host 10 and is capable of providing the testing result of the illuminating element 131. In the present preferred embodiment, the computer peripheral device 11 is a computer screen. The testing socket 12 is connected with the computer host 10 and is capable of testing the illuminating element 131, wherein the testing socket 12 comprises a first mask 121, a first photosensitive circuit 122, a second mask 123, a second photosensitive circuit 124 and a judgment circuit 125. The first mask 121 is capable of covering an unilluminated area 132 (i.e. the area not disposed with the illuminating element 131) on the circuit board 13. The first photosensitive circuit 122 has a first photosensitive element cds1, wherein the first photosensitive element cds1 is located within the first mask 121 and capable of detecting a brightness of the unilluminated area 132, and the first photosensitive circuit 122 is capable of generating a reference voltage $V_{ref}$ according to the brightness of the unilluminated area 132. In addition, the second mask 123 is capable of covering the illuminating element 131 on the circuit board 13. The second photosensitive circuit 124 has a second photosensitive element cds2, wherein the second photosensitive element cds2 is located within the second mask 123 and capable of detecting a brightness of the illuminating element 131, and the second photosensitive circuit 124 is capable of generating a testing voltage V according to the brightness of the illuminating element 131. In the present preferred embodiment, the first photosensitive element cds1 and the second photosensitive element cds2 are photosensitive resistors.

Besides the first photosensitive element cds1, the first photosensitive circuit 122 in FIG. 3 further comprises a first resistor R1 and a first capacity C1. The first resistor R1 is connected with the first photosensitive element cds1 in series, wherein the first resistor R1 is connected with the voltage VCC, the first photosensitive element cds1 is grounding, and the reference voltage $V_{ref}$ is obtained from dividing the voltage VCC by the first resistor R1 and the first photosensitive element cds1. In addition, the first capacity C1 is connected with the first photosensitive element cds1 in parallel and is capable of filtering electric waves. In the second photosensitive circuit 124, the testing voltage V is obtained from dividing the voltage VCC by the second photosensitive element cds2 of the second photosensitive circuit 124 and the second resistor R2 as well, wherein the circuit layout is completely the same as the first photosensitive circuit 122 and omitted herein. It should be noted that the resistance values of the first photosensitive element cds1, the first resistor R1 and the first capacity C1 in the first photosensitive circuit 122 are completely the same as the resistance values of the second photosensitive element cds2, the second resistor R2 and the second capacity C2 in the second photosensitive circuit 124. Therefore, the testing voltage V generated from the second photosensitive circuit 124 is equal to the reference voltage $V_{ref}$ when the illuminating element 131 covered by the second mask 123 dose not generate the light beam L.

Figure 4:
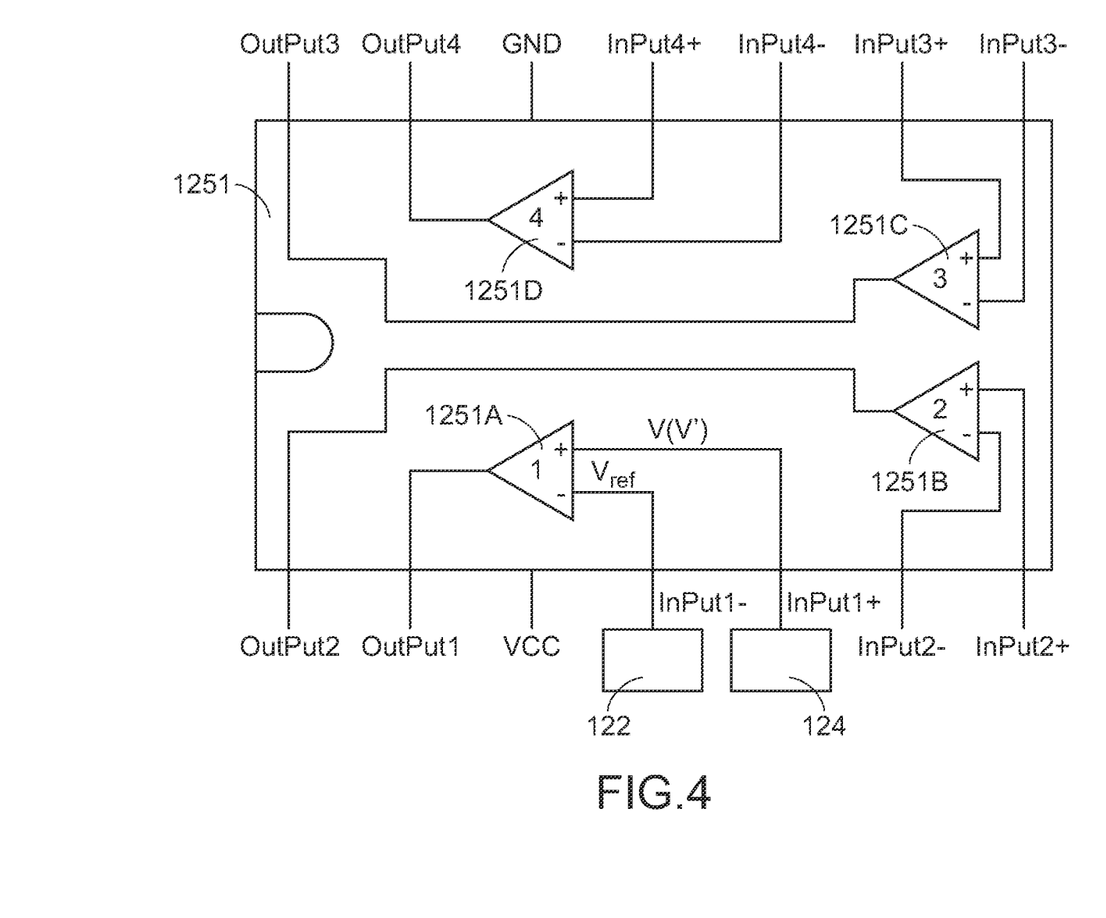
FIG. 4 illustrates a schematic internal circuit diagram of a comparing unit of the system for testing illuminating elements according to the first preferred embodiment of the present invention.

The judgment circuit 125 of the testing socket 12 is illustrated herein after. FIG. 4 illustrates a schematic internal circuit diagram of a comparing unit of the system for testing illuminating elements according to the first preferred embodiment of the present invention. Referring to FIG. 3 and FIG. 4 together, the judgment circuit 125 is connected with the first photosensitive circuit 122, the second photosensitive circuit 124 and the computer host 10 respectively, and capable of determining whether the illuminating element 131 passes the test or not by judging whether the testing voltage V is larger than the reference voltage $V_{ref}$ or not. The judgment circuit 125 comprises a comparing unit 1251 and a controlling unit 1252. The comparing unit 1251 is connected with the first photosensitive circuit 122 and the second photosensitive circuit 124 as a positive logic connection, and capable of comparing the testing voltage V and the reference voltage $V_{ref}$, so as to output a corresponding logic level signal. In addition, the controlling unit 1252 is connected with the comparing unit 1251 and the computer host 10 and capable of outputting a corresponding signal to the computer host 10 according to the logic level signal. In the preferred embodiment, the comparing unit 1251 is a comparator, and the controlling unit 1252 of the testing socket 12 is connected with the computer host 10 via a RS232 interface connection cable.

According to the FIG. 4, it is understood that the comparing unit 1251 is composed of four operational amplifiers (OPA) 1251A, 1251B, 1251C and 1251D. In the preferred embodiment, the second operational amplifier 1251B, the third operational amplifier 1251C and the fourth operational amplifier 1251D are inactive and the detail description thereof are omitted herein. According to the FIG. 3 and FIG. 4, it is understood that the reference voltage $V_{ref}$ generated from the first photosensitive circuit 122 is inputted from an INPUT 1−pin of the comparing unit 1251, wherein the INPUT 1−pin is a negative input end of the first operational amplifier 1251A. On the other hand, the testing voltage V generated from the second photosensitive circuit 124 is inputted from an INPUT 1+pin of the comparing unit 1251, wherein the INPUT 1+pin is a positive input end of the first operational amplifier 1251A. According to the above descriptions, it is understood that the positive logic connection means that the reference voltage $V_{ref}$ generated according to the circuit layout of the first photosensitive circuit 122 is inputted from the negative input end of the first operational amplifier 1251A, and the testing voltage V generated according to the circuit layout of the second photosensitive circuit 124 is inputted from the positive input end of the first operational amplifier 1251A An operation condition of the system 1 for testing illuminating elements according to the present invention is illustrated herein after. Referring to FIG. 2 and FIG. 3 together again, after the system 1 for testing illuminating elements is set up and the circuit board 13 is connected with the switch circuit 14, it is started to test the illuminating element 131 on the circuit board 13. It is started from examining whether the illuminating element 131 on the circuit board 13 is lightless or not, i.e. the step S1. If not, the illuminating element 131 is turned off by the switch circuit 14, i.e. the step S2, and then examining whether the illuminating element 131 is lightless or not once again. If the illuminating element 131 is lightless, then covering the unilluminated area 132 of the circuit board 13 with the first mask 121 of the testing socket 12 and covering the illuminating element 131 of the circuit board 13 with the second mask 123 of the testing socket 12, i.e. the step S3. After ensuring there is no light entering into the first mask 121 and the second mask 123, the switch circuit 14 turns on the illuminating element 131 to let the illuminating element 131 generate the light beam L, i.e. the step S4. At this time, there is no light beam L existing within the first mask 121, while there has the light beam L existing within the second mask 123.

Next, the first photosensitive element cds1 located within the first mask 121 is used for detecting the brightness of the unilluminated area 132 (i.e. no brightness) and thus obtaining the reference voltage $V_{ref}$. In addition, the second photosensitive element cds2 located within the second mask 123 is used for detecting the brightness of the light beam L of the illuminating element 131 and thus obtaining the testing voltage V. Within the first mask 121, the first photosensitive element cds1 fails to detect the light beam L, and thus the resistance value of the first photosensitive element cds1 (for example 5KΩ) is stable, and the reference voltage $V_{ref}$ corresponding to the resistance value (for example 1.5V) is outputted. Within the second mask 123, the resistance value of the second photosensitive element cds2 is decreased (for example decreased from 5KΩ to 3KΩ) when the second photosensitive element cds2 is lighted by the light beam L. Since the resistance value of the second photosensitive element cds2 is decreased, the testing voltage V outputted by the second photosensitive circuit 124 is increased (for example increased from 1.5V to 2.5V).

The testing voltage V is outputted to the positive output end of the comparing unit 1251 by the second photosensitive circuit 124, the reference voltage $V_{ref}$ is outputted to the negative output end of the comparing unit 1251 by the first photosensitive circuit 122, and the comparing unit 1251 judges whether the testing voltage V is larger than the reference voltage $V_{ref}$ or not, i.e. the step S6. If the comparing unit 1251 judges the testing voltage V is not larger than the reference voltage $V_{ref}$ (i.e. the testing voltage V is close to the reference voltage $V_{ref}$), which means that the illuminating element 131 being switched on dose not generate the light beam L, then the testing voltage V should be unchanged (i.e. maintained at 1.5V) and equal to the reference voltage $V_{ref}$ or close to the reference voltage $V_{ref}$. At this moment, the comparing unit 1251 outputs a low logic level signal to the controlling unit 1252. Therefore, the controlling unit 1252 receiving the low logic level signal generates a testing failure signal to the computer host 10, and then the testing failure signal is provided by the computer peripheral device 11 with images as displaying that the test of the illuminating element 131 is failure, i.e. the step S7. On the contrary, if the comparing unit 1251 judges the testing voltage V is larger than the reference voltage $V_{ref}$ (i.e. the testing voltage V is significantly larger than the reference voltage $V_{ref}$), then the comparing unit 1251 outputs a high logic level signal to the controlling unit 1252 and switches off the illuminating element 131 by the switch circuit 14. Therefore, the second photosensitive element cds2 detects the brightness of the illuminating element 131 being switched off (i.e. no brightness) to obtain another testing voltage V', i.e. the step S8.

Finally, the comparing unit 1251 judges whether the another testing voltage V' is larger than the reference voltage $V_{ref}$ or not, i.e. the step S9. If the another testing voltage V' is larger than the reference voltage $V_{ref}$, which means that the illuminating element 131 being switched off still generates the light beam L, then the comparing unit 1251 generates the low logic level signal. Therefore, the controlling unit 1252 receiving the low logic level signal outputs the testing failure signal to the computer host 10, and then the testing failure signal is displayed by the computer peripheral device 11 with images as displaying that the test of the illuminating element 131 is failure as well. On the contrary, if the another testing voltage V' is not larger than the reference voltage $V_{ref}$ (i.e. the another testing voltage V' is equal to or close to the reference voltage $V_{ref}$), which means that the illuminating element 131 has being switched off already, then the brightness detected by the second photosensitive element cds2 is no brightness. Therefore, the comparing unit 1251 generates another high logic level signal, and then the controlling unit 1252 receiving the high logic level signal and the another high logic level signal outputs the testing pass signal to the computer host 10. In addition, the testing pass signal is also provided by the computer peripheral device 11 with images as displaying that the test of the illuminating element 131 is passed. After that, the test of the illuminating element 131 is finished.

Figure 5A:
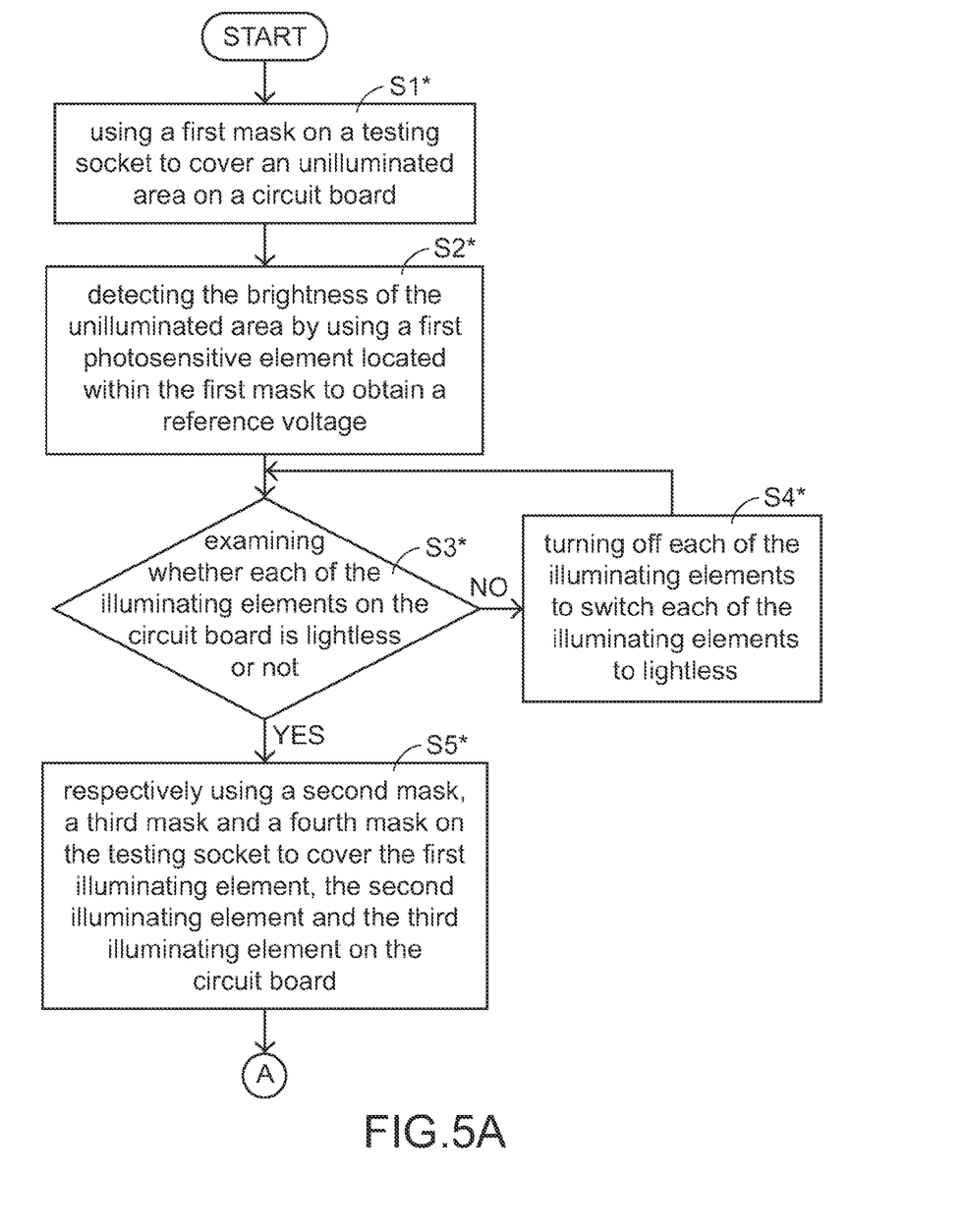
FIG. 5 illustrates a schematic block flow chart of a method for testing illuminating elements according to a second preferred embodiment of the present invention.
Figure 5B:
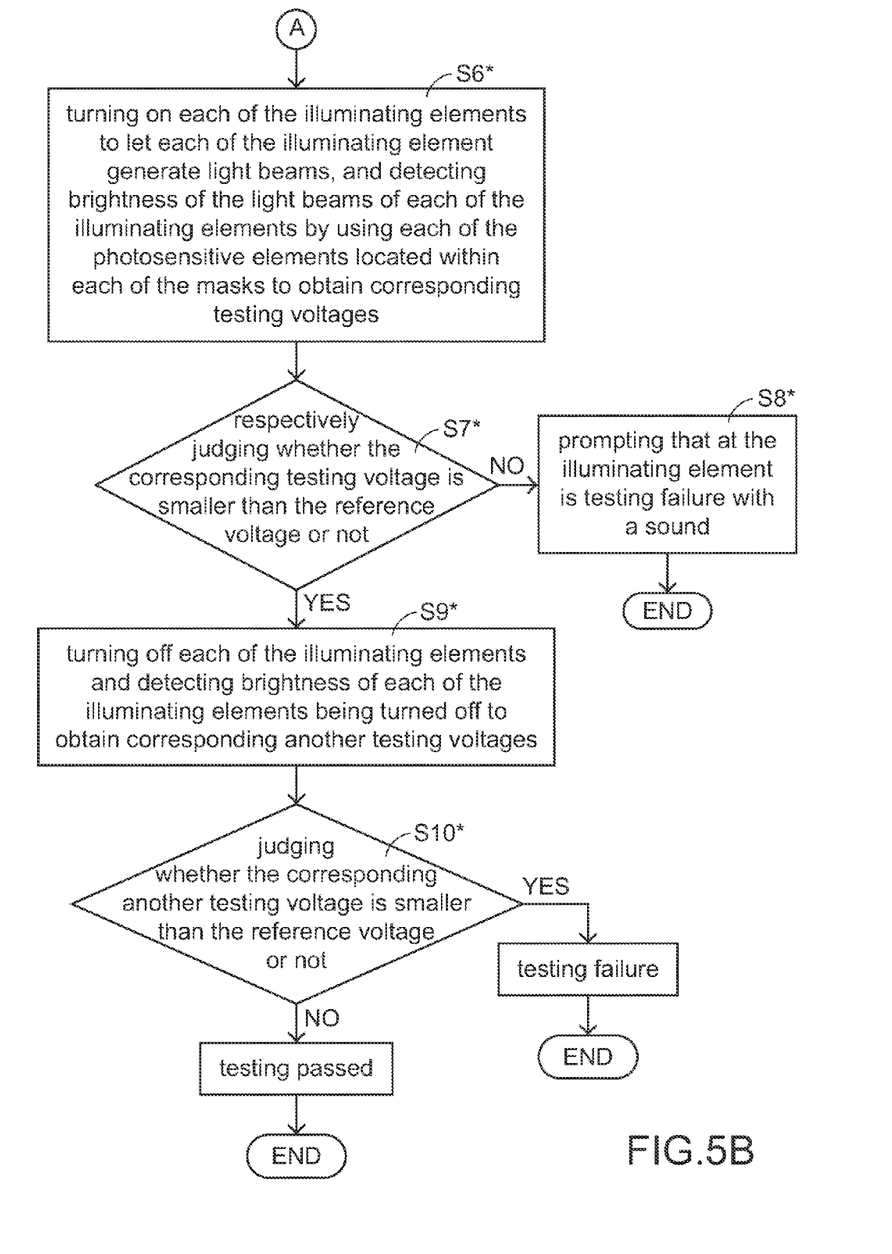

In addition, the present invention further provides a second preferred embodiment. FIG. 5 illustrates a schematic block flow chart of a method for testing illuminating elements according to a second preferred embodiment of the present invention. Referring to FIG. 5, the method for testing illuminating elements of the present invention comprises the following steps. The step S1* is using a first mask on a testing socket to cover an unilluminated area on a circuit board. The step S2* is detecting the brightness of the unilluminated area by using a first photosensitive element located within the first mask to obtain a reference voltage. The step S3* is examining whether each of the illuminating elements on the circuit board is lightless or not. The step S4* is turning off each of the illuminating elements to switch each of the illuminating elements to lightless. The step S5* is respectively using a second mask, a third mask and a fourth mask on the testing socket to cover the first illuminating element, the second illuminating element and the third illuminating element on the circuit board. The step S6* is turning on each of the illuminating elements to let each of the illuminating element generate light beams, and detecting brightness of the light beams of each of the illuminating elements by using each of the photosensitive elements located within each of the masks to obtain corresponding testing voltages. The step S7* is respectively judging whether the corresponding testing voltage is smaller than the reference voltage or not. The step S8* is prompting that at the illuminating element is testing failure with a sound. The step S9* is turning off each of the illuminating elements and detecting brightness of each of the illuminating elements being turned off to obtain corresponding another testing voltages. Further, the step S10* is judging whether the corresponding another testing voltage is smaller than the reference voltage or not.

The step S4* is processed when each of the illuminating elements is not lightless in the step S3* for ensuring each of the illuminating elements being lightless. After the step S4* is processed, the step S3* is processed again until each of the illuminating elements being lightless.

The step S7* is judging whether the corresponding testing voltage of each of the illuminating elements is smaller than the reference voltage or not. The step S8* is processed when any one of the testing voltages is not smaller than the reference voltage, and then the test of the corresponding illuminating element is finished, while the step S9* is processed when the testing voltage is smaller than the reference voltage. In the step S10*, the corresponding illuminating element is judged as testing passed when any one of the another testing voltages is not smaller than the reference voltage, while the corresponding illuminating element is judged as testing failure when any one of the another testing voltages is smaller than the reference voltage. In the present preferred embodiment, an internal circuit within the testing socket is disposed as a negative logic connection, and thus judgment criterions between the second preferred embodiment and the first preferred embodiment are different.

Figure 6:
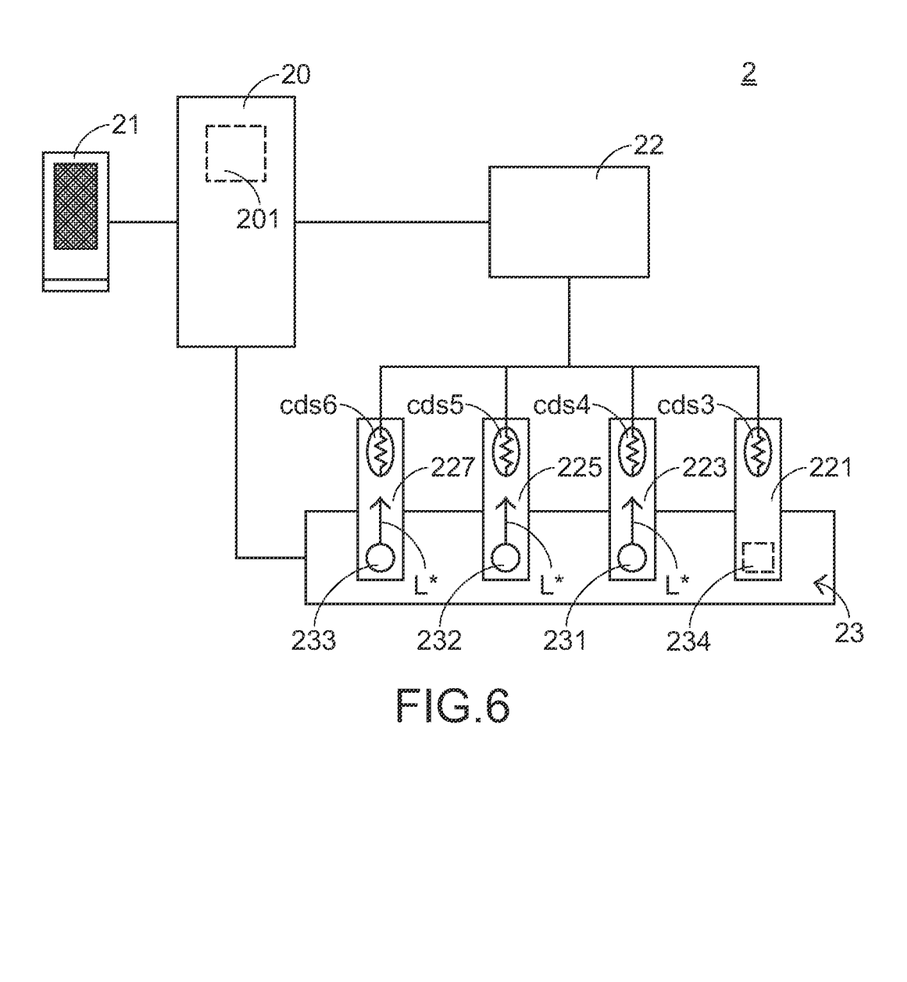
FIG. 6 illustrates a schematic structural view of a system for testing illuminating elements according to the second preferred embodiment of the present invention.
Figure 7:
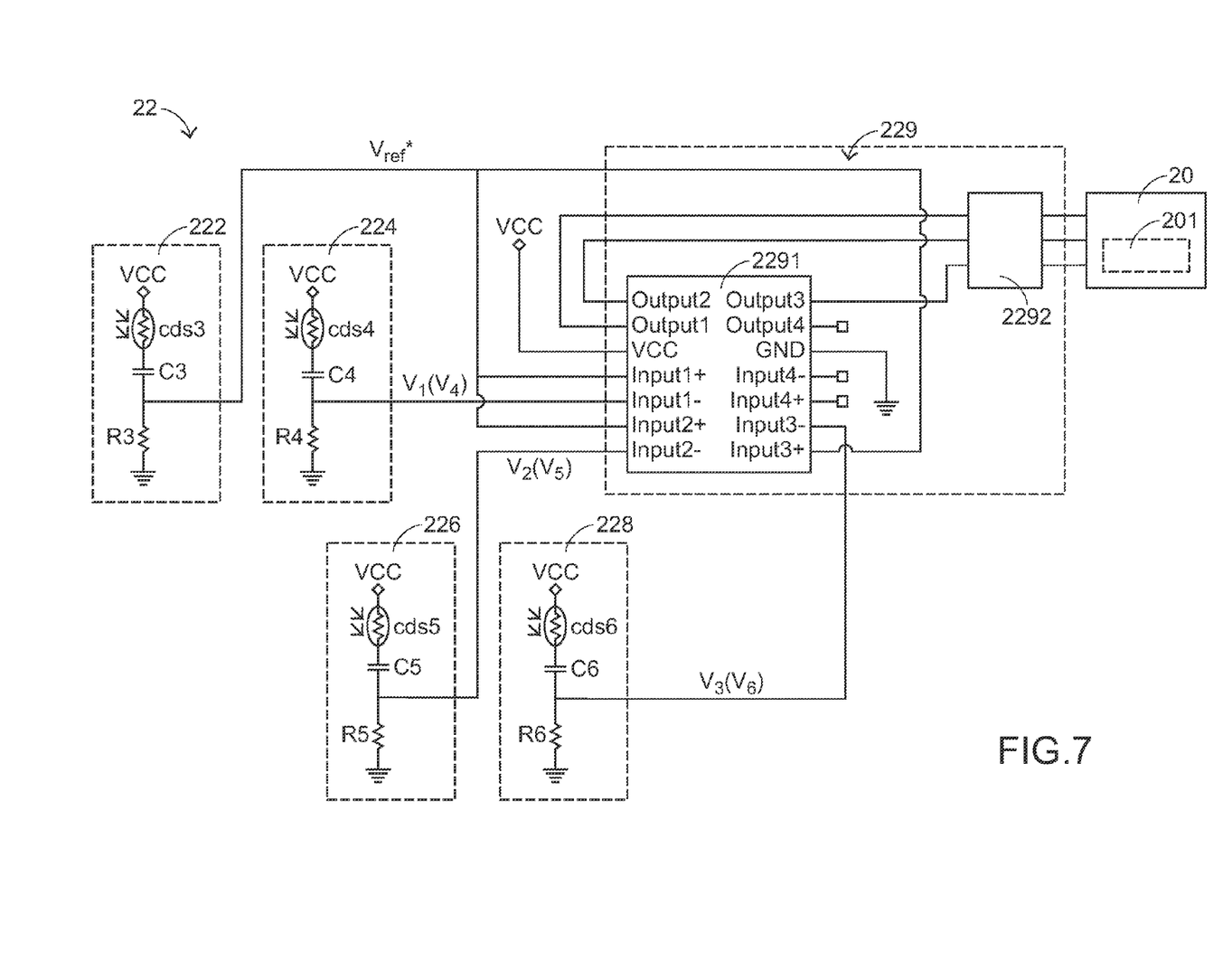
FIG. 7 illustrates a schematic internal circuit diagram of the system for testing illuminating elements according to the second preferred embodiment of the present invention.

A system for testing illuminating elements of the present invention is illustrated herein after. FIG. 6 illustrates a schematic structural view of a system for testing illuminating elements according to the second preferred embodiment of the present invention. FIG. 7 illustrates a schematic internal circuit diagram of the system for testing illuminating elements according to the second preferred embodiment of the present invention. Referring to FIG. 6 and FIG. 7 together, a system 2 for testing illuminating elements comprises a computer host 20, a computer peripheral device 21 and a testing socket 22, and the system 2 for testing illuminating elements is capable of testing a first illuminating element 231, a second illuminating element 232 and a third illuminating element 233 on a circuit board 23. In addition, the circuit board 23 is connected with the computer host 20, so as to provide electric power to the plurality of illuminating elements 231~233, and also able to switch on or switch off the plurality of illuminating elements 231~233 by the signals from the computer host 20. The circuit board 23 in the present preferred embodiment is applied to a keyboard, and the plurality of illuminating elements 231~233 are LEDs. In another word, the first illuminating element 231, the second illuminating element 232 and the third illuminating element 233 are the Num Lock indicating light, Caps Lock indicating light and Scroll Lock indicating light on the keyboard respectively.

In the system 2 for testing illuminating elements, the computer host 20 comprises a testing program 201, and the computer peripheral device 21 is connected with the computer host 20 and is capable of providing testing results of the plurality of illuminating elements 231~233. In the present preferred embodiment, the computer peripheral device 21 is an audio device. The testing socket 22 is connected with the computer host 20 and capable of testing the plurality of illuminating elements 231~233, wherein the testing socket 22 comprises a first mask 221, a first photosensitive circuit 222, a second mask 223, a second photosensitive circuit 224, a third mask 225, a third photosensitive circuit 226, a fourth mask 227, a fourth photosensitive circuit 228 and a judgment circuit 229. The first mask 221 is capable of covering an unilluminated area 234 (i.e. the area not disposed with the illuminating elements) on the circuit board 23. The first photosensitive circuit 222 has a first photosensitive element cds3, wherein the first photosensitive element cds3 is located within the first mask 221 and capable of detecting a brightness of the unilluminated area 234, and the first photosensitive circuit 222 is capable of generating a reference voltage $V_{ref}*$ according to the brightness of the unilluminated area 234.

The second mask 223 is capable of covering the first illuminating element 231 on the circuit board 23. The second photosensitive circuit 224 has a second photosensitive element cds4, wherein the second photosensitive element cds4 is located within the second mask 223 and capable of detecting a brightness of the first illuminating element 231, and the second photosensitive circuit 224 is capable of generating a first testing voltage V1 according to the brightness of the first illuminating element 231. Similarly, the third mask 225 is capable of covering the second illuminating element 232 on the circuit board 23. The third photosensitive circuit 226 has a third photosensitive element cds5, wherein the third photosensitive element cds5 is located within the third mask 225 and capable of detecting a brightness of the second illuminating element 232, and the third photosensitive circuit 226 is capable of generating a second testing voltage V2 according to the brightness of the second illuminating element 232. The fourth mask 227 is capable of covering the third illuminating element 233 on the circuit board 23. The fourth photosensitive circuit 228 has a fourth photosensitive element cds6, wherein the fourth photosensitive element cds6 is located within the fourth mask 227 and capable of detecting a brightness of the third illuminating element 233, and the fourth photosensitive circuit 228 is capable of generating a third testing voltage V3 according to the brightness of the third illuminating element 233. In the present preferred embodiment, the first photosensitive element cds3, the second photosensitive element cds4, the third photosensitive element cds5 and the fourth photosensitive element cds6 are all photosensitive resistors, and resistance values of the first photosensitive element cds3, the second photosensitive element cds4, the third photosensitive element cds5 and the fourth photosensitive element cds6 are completely the same.

Besides the first photosensitive element cds3, the first photosensitive circuit 222 in FIG. 7 further comprises a first resistor R3 and a first capacity C3. The first resistor R3 is connected with the first photosensitive element cds3 in series, wherein the first resistor R3 is grounding, the first photosensitive element cds3 is connected with the voltage VCC, and the reference voltage $V_{ref}*$ is obtained from dividing the voltage VCC by the first resistor R3 and the first photosensitive element cds3. In addition, the first capacity C3 is connected with the first photosensitive element cds3 in series and is capable of filtering electric waves. It should be noted that the circuit layout of the first photosensitive circuit 222 in the present preferred embodiment is different to that of the first photosensitive circuit 122 in the first preferred embodiment, and thus the value of the reference voltage $V_{ref}*$ obtained therefrom is also different to the reference voltage $V_{ref}$.

In the second photosensitive circuit 224, the first testing voltage V1 is obtained from dividing the voltage VCC by the second photosensitive element cds4 of the second photosensitive circuit 224 and the second resistor R4 as well, wherein the circuit layout is completely the same as the first photosensitive circuit 222 and omitted herein. Similarly, in the third photosensitive circuit 226, the second testing voltage V2 is obtained from dividing the voltage VCC by the third photosensitive element cds5 of the third photosensitive circuit 226 and the third resistor R5 as well. In addition, in the fourth photosensitive circuit 228, the third testing voltage V3 is obtained from dividing the voltage VCC by the fourth photosensitive element cds6 of the fourth photosensitive circuit 228 and the fourth resistor R6 as well. What similar to the first preferred embodiment is that the first testing voltage V1, the second testing voltage V2 and the third testing voltage V3 generated from the second photosensitive circuit 224, the third photosensitive circuit 226 and the fourth photosensitive circuit 227 respectively are all equal to the reference voltage $V_{ref}*$ when the first illuminating element 231, the second illuminating element 232 and the third illuminating element 233 respectively covered by the second mask 223, the third mask 225 and the fourth mask 227 do not generate the light beam L*.

Figure 8:
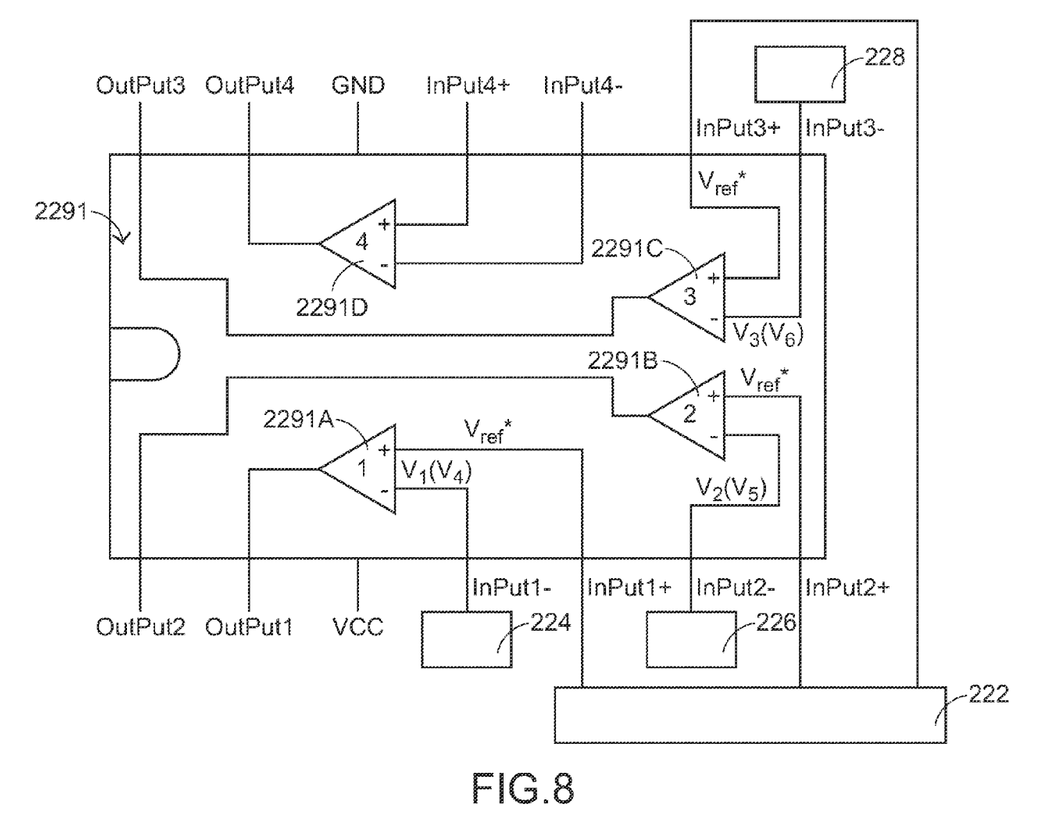
FIG. 8 illustrates a schematic internal circuit diagram of a comparing unit of the system for testing illuminating elements according to the second preferred embodiment of the present invention.

The judgment circuit 229 of the testing socket 22 is illustrated herein after. FIG. 8 illustrates a schematic internal circuit diagram of a comparing unit of the system for testing illuminating elements according to the second preferred embodiment of the present invention. Referring to FIG. 7 and FIG. 8 together, the judgment circuit 229 is connected with the first photosensitive circuit 222, the second photosensitive circuit 224, the third photosensitive circuit 226, the fourth photosensitive circuit 228 and the computer host 20 respectively, and capable of determining whether the plurality of illuminating elements 231~233 pass the test or not by judging whether the testing voltages V1, V2, V3 are larger than the reference voltage $V_{ref}*$ or not. The judgment circuit 229 comprises a comparing unit 2291 and a transforming unit 2292. The comparing unit 2291 is connected with the first photosensitive circuit 222, the second photosensitive circuit 224, the third photosensitive circuit 226 and the fourth photosensitive circuit 228 as negative logic connections, and capable of comparing the testing voltages V1, V2, V3 and the reference voltage $V_{ref}*$, so as to output corresponding logic level signals. Besides, the transforming unit 2292 is connected with the comparing unit 2291 and the computer host 20 respectively and capable of transforming the logic level signals into specific format signals. In the present preferred embodiment, the comparing unit 2292 is a comparator and connected with the computer host 20 via an USB interface connection cable, while the transforming unit 2292 is a single chip micro processor capable of transforming the logic level signal into the USB format signal.

According to the FIG. 8, it is understood that the comparing unit 2291 is composed of four operational amplifiers 2291A, 2291B, 2291C and 2291D. In the present preferred embodiment, the fourth operational amplifier 2291D is inactive and the detail description thereof is omitted herein. According to the FIG. 7 and FIG. 8, it is understood that the reference voltage $V_{ref}*$ generated from the first photosensitive circuit 222 is inputted from an INPUT 1+pin, an INPUT 2+pin and an INPUT 3+pin of the comparing unit 2291 respectively, wherein the INPUT 1+pin is the positive input end of the first operational amplifier 2291A, the INPUT 2+pin is the positive input end of the second operational amplifier 2291B and the INPUT 3+pin is the positive input end of the third operational amplifier 2291C. On the other hand, the first testing voltage V1 generated from the second photosensitive circuit 224 is inputted from the INPUT 1−pin of the comparing unit 2291, wherein the INPUT 1−pin is the negative input end of the first operational amplifier 2291A. In addition, the second testing voltage V2 generated from the third photosensitive circuit 226 is inputted from the INPUT 2−pin of the comparing unit 2291, wherein the INPUT 2−pin is the negative input end of the second operational amplifier 2291B. Furthermore, the third testing voltage V3 generated from the fourth photosensitive circuit 228 is inputted from the INPUT 3-pin of the comparing unit 2291, wherein the INPUT 3-pin is the negative input end of the third operational amplifier 2291C. According to the above descriptions, it is understood that the negative logic connection means that the reference voltage $V_{ref}*$ is inputted to the positive input end of the first operational amplifier 2291A, and the first testing voltage V1, the second testing voltage V2 and the third testing voltage V3 are respectively inputted to the negative input end of the first operational amplifier 2291A, the second operational amplifier 2291B and the third operational amplifier 2291C.

An operation condition of the system 2 for testing illuminating elements according to the present invention is illustrated herein after. Referring to FIG. 6 and FIG. 7 together again, after the system 2 for testing illuminating elements is set up and the circuit board 23 is connected with the computer host 20, it is started to test the plurality of illuminating elements 231~233 on the circuit board 23. It is started from covering the unilluminated area 234 of the circuit board 23 with the first mask 221 of the testing socket 22, i.e. the step S1*. After ensuring there is no light entering into the first mask 221, the brightness of the unilluminated area 234 is detected by using the first photosensitive element 2221 located within the first mask 221 to obtain a reference voltage $V_{ref}*$, i.e. the step S2*. Within the first mask 221, the first photosensitive element cds3 fails to detect the light beam L*, and thus the resistance value of the first photosensitive element cds3 (for example 5KΩ) is stable, and the reference voltage $V_{ref}$ corresponding to the resistance value (for example 2V) is outputted. The next step is examining whether the plurality of illuminating elements 231~233 on the circuit board 23 are lightless or not, i.e. the step S3*. If not, the illuminating elements 231~233 are turned off by signals generated from the computer host 20, i.e. the step S4*, and then examining whether the plurality of illuminating elements 231~233 are lightless or not once again. If the plurality of illuminating elements 231~233 are lightless, then covering the first illuminating element 231, the second illuminating element 232 and the third illuminating element 233 of the circuit board 23 with the second mask 223, the third mask 225 and the fourth mask 227 of the circuit board 23 respectively, i.e. the step S5*.

After ensuring there is no light entering into the second mask 223, the third mask 225 and the fourth mask 227, the plurality of illuminating elements 231~233 are turned on by the signals generated from the computer host 20 to let the plurality of illuminating elements 231~233 generate the light beams L* respectively, and detecting the brightness of the light beams L* of the first illuminating element 231, the second illuminating element 232 and the third illuminating element 233 by using the second photosensitive element cds4, the third photosensitive element cds5 and the fourth photosensitive element cds6 respectively, so as to obtain the first testing voltage V1, the second testing voltage V2 and the third testing voltage V3, i.e. the step S6*. Within the second mask 223, the second photosensitive element cds4 is lighted by the light beam L*, and thus the resistance value thereof is decreased (for example decreased from 5KΩ to 3KΩ). Therefore, the first testing voltage V1 outputted by the second photosensitive circuit 224 is decreased (for example decreased from 2V to 1.25V). Herein, the second testing voltage V2 and the third testing voltage V3 are similarly and omitted herein.

The first testing voltage V1, the second testing voltage V2 and the third testing voltage V3 are outputted to the three negative output ends of the comparing unit 2291, the reference voltage $V_{ref}*$ is outputted to the positive output end of the comparing unit 2291 by the first photosensitive circuit 222, and the comparing unit 2291 respectively judges whether the first testing voltage V1, the second testing voltage V2 and the third testing voltage V3 are smaller than the reference voltage $V_{ref}*$ or not, i.e. the step S7*. If the comparing unit 2291 judges any one of the testing voltages V1, V2 and V3 is not smaller than the reference voltage $V_{ref}*$ (i.e. the testing voltage V1, V2 or V3 is close to the reference voltage $V_{ref}*$), which means that the illuminating element 231, 232 or 233 being switched on dose not generate the light beam L*, then the testing voltage V1, V2 or V3 should be unchanged (i.e. maintained at 2V) and equal to the reference voltage $V_{ref}*$ or close to the reference voltage $V_{ref}*$. At this moment, the comparing unit 2291 outputs a low logic level signal to the computer host 20, and the testing program 201 in the computer host 20 receives the low logic level signal and generates a testing failure signal. Further, the testing failure signal is provided by the computer peripheral device 21 with sounds as prompting that the test of the corresponding illuminating element 231, 232 or 233 is failure, i.e. the step S8*.

On the contrary, if the comparing unit 2291 judges the testing voltage V1, V2 or V3 is smaller than the reference voltage $V_{ref}*$ (i.e. the testing voltage V1, V2 or V3 is smaller than the reference voltage $V_{ref}*$ significantly), then the comparing unit 2291 outputs a high logic level signal. The high logic level signal is transformed into a first USB format signal corresponding to the high logic level signal by the transforming unit 2292 and outputted to the computer host 20, and the computer host 20 generates a signal to switch off the illuminating element 231, 232 or 233 correspondingly. Hence, the photosensitive element cds4, cds5 or cds6 correspondingly detects the brightness of the illuminating element 231, 232 or 233 being switched off (i.e. no brightness) to obtain a corresponding one of the fourth testing voltage V4, a fifth testing voltage V5 or a sixth testing voltage V6, i.e. the step S9*.

Finally, the comparing unit 2291 judges whether the fourth testing voltage V4, the fifth testing voltage V5 or the sixth testing voltage V6 is smaller than the reference voltage $V_{ref}*$ or not respectively, i.e. the step S10*. If the corresponding one of the fourth testing voltage V4, the fifth testing voltage V5 or the sixth testing voltage V6 is smaller than the reference voltage $V_{ref}*$, which means that the illuminating element 231, 232 or 233 being switched off still generates the light beam L*, then the comparing unit 2291 generates the low logic level signal. The low logic level signal is transformed into a second USB format signal corresponding to the low logic level signal by the transforming unit 2292 and outputted to the computer host 20. After that, the testing program 201 of the computer host 20 generates the testing failure signal according to the second USB format signal, and then prompting that the test of the illuminating element 231, 232 or 233 is failure by the computer peripheral device 21 with sounds.

On the contrary, if the fourth testing voltage V4, the fifth testing voltage V5 or the sixth testing voltage V6 is not smaller than the reference voltage $V_{ref}*$ (i.e. the fourth testing voltage V4, the fifth testing voltage V5 or the sixth testing voltage V6 is equal to or close to the reference voltage $V_{ref}*$), which means that the illuminating element 231, 232 or 233 has being switched off already, then the brightness detected by the photosensitive element cds4, cds5 or cds6 is no brightness. Hence, the comparing unit 2291 respectively generates another high logic level signal, wherein the another high logic level signal is transformed into a third USB format signal corresponding to the another high logic level signal by the transforming unit 2292. After that, the testing program 201 receiving the first USB format signal and the third USB format signal generates the testing pass signal, and then the testing pass signal is also provided by the computer peripheral device 21 with sounds as prompting that the test of the illuminating element 231, 232 or 233 is passed in sequential. Afterward, the test of the illuminating element 231, 232 or 233 is finished.

According to the above mentioned preferred embodiments, it can be understood that the method for testing illuminating elements and the system for testing illuminating elements of the present invention detect the brightness of the lightless illuminating element by the first photosensitive element located within the first mask to obtain the reference voltage, and then detect the brightness of the lighting illuminating element by the second photosensitive element located within the second mask to obtain the testing voltage. Therefore, it is able to judge whether the illuminating element being turned on (or turned off) is lighting (or lightless) or not by comparing the testing voltage and the reference voltage directly. When circuit parameters of the first photosensitive circuit exists errors due to some external factors, circuit parameters of the second photosensitive circuit exists errors as well, since the first photosensitive circuit and the second photosensitive circuit are completely the same and the layout positions thereof are quite close. Therefore, the errors affect the reference voltage and the testing voltage slightly, and thus the probability of misjudgment is decreased as well. In addition, the method for testing illuminating elements and the system for testing illuminating elements of the present invention may be practiced by the computer host as well. In another word, it is able to test the illuminating elements automatically rather than manually.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A system for testing illuminating elements capable of testing an illuminating element disposed on an circuit board, wherein the system for testing illuminating elements comprises:
    a computer host capable of outputting a testing result of the illuminating element; and
    a testing socket connected with the computer host, and capable of testing the illuminating element, wherein the testing socket comprises:
        a first mask capable of covering an unilluminated area on the circuit board;
        a first photosensitive circuit having a first photosensitive element, wherein the first photosensitive element is located within the first mask, and the first photosensitive circuit is capable of generating a reference voltage according to a brightness of the unilluminated area detected by the first photosensitive element;
        a second mask capable of covering the illuminating element;
        a second photosensitive circuit having a second photosensitive element, wherein the second photosensitive element is located within the second mask, and the second photosensitive circuit is capable of generating a testing voltage according to a brightness of the illuminating element detected by the second photosensitive element; and
        a judgment circuit respectively connected with the first photosensitive circuit, the second photosensitive circuit and the computer host, and capable of determining whether the illuminating element passes a testing process or not by judging whether the testing voltage is larger than the reference voltage or not, wherein the judgment circuit comprises:
            a comparing unit connected with the first photosensitive circuit and the second photosensitive circuit, and capable of comparing the testing voltage and the reference voltage, wherein the comparing unit outputs a high logic level signal when the first photosensitive circuit and the second photosensitive circuit connect with the comparing unit as a positive logic connection and the testing voltage obtained according to the illuminating element being driven is larger than the reference voltage, while the comparing unit outputs a low logic level signal when the testing voltage is not larger than the reference voltage; or the comparing unit outputs the high logic level signal when the first photosensitive circuit and the second photosensitive circuit connect with the comparing unit as a negative logic connection and the testing voltage is smaller than the reference voltage, while the comparing unit outputs the low logic level signal when the testing voltage is not small than the reference voltage; and
            a controlling unit connected with the comparing unit and the computer host, capable of receiving the high logic level signal or receiving the low logic level signal, and capable of generating a testing failure signal to the computer host when receiving the low logic level signal;
        wherein the illuminating element is turned off and detected by the second photosensitive circuit after the controlling unit receives the high logic level signal, so as to obtain another testing voltage, and then the comparing unit judges whether the illuminating element passes a test process or not according to the another testing voltage and the reference voltage; wherein the comparing unit outputs another high logic level signal when the first photosensitive circuit and the second photosensitive circuit are connected with the comparing unit as the positive logic connection and the another testing voltage is not larger than the reference voltage, and thus the controlling unit generates a testing pass signal to the computer host according to the high logic level signal and the another logic level signal, while the comparing unit outputs the low logic level signal when the another testing voltage is larger than the reference voltage; or the comparing unit outputs the another high logic level signal when the first photosensitive circuit and the second photosensitive circuit are connected with the comparing unit as the negative logic connection and the another testing voltage is not smaller than the reference voltage, and thus the controlling unit generates the testing pass signal to the computer host according to the high logic level signal and the another logic level signal, while the comparing unit outputs the low logic level signal when the another testing voltage is smaller than the reference voltage.

2. A system for testing illuminating elements capable of testing an illuminating element disposed on an circuit board, wherein the system for testing illuminating elements comprises:
    a computer host capable of outputting a testing result of the illuminating element; and
    a testing socket connected with the computer host, and capable of testing the illuminating element, wherein the testing socket comprises:

a first mask capable of covering an unilluminated area on the circuit board;

a first photosensitive circuit having a first photosensitive element, wherein the first photosensitive element is located within the first mask, and the first photosensitive circuit is capable of generating a reference voltage according to a brightness of the unilluminated area detected by the first photosensitive element;

a second mask capable of covering the illuminating element;

a second photosensitive circuit having a second photosensitive element, wherein the second photosensitive element is located within the second mask, and the second photosensitive circuit is capable of generating a testing voltage according to a brightness of the illuminating element detected by the second photosensitive element; and a judgment circuit respectively connected with the first photosensitive circuit, the second photosensitive circuit and the computer host, and capable of determining whether the illuminating element passes a testing process or not by judging whether the testing voltage is larger than the reference voltage or not, wherein the judgment circuit comprises a comparing unit connected with the first photosensitive circuit and the second photosensitive circuit, and capable of comparing the testing voltage and the reference voltage; the comparing unit outputs a high logic level signal to the computer host when the first photosensitive circuit and the second photosensitive circuit are connected with the comparing unit as a positive logic connection and the testing voltage is larger than the reference voltage, while the comparing unit outputs a low logic level signal to the computer host when the testing voltage is not larger than the reference voltage; or the comparing unit outputs the high logic level signal to the computer host when the first photosensitive circuit and the second photosensitive circuit are connected with the comparing unit as a negative logic connection and the testing voltage is smaller than the reference voltage, while the comparing unit outputs the low logic level signal to the computer host when the testing voltage is not smaller than the reference voltage;

wherein the illuminating element is turned off and detected by the second photosensitive circuit after the computer host receives the high logic level signal, so as to obtain another testing voltage, and then the comparing unit judges whether the illuminating element passes a test process or not according to the another testing voltage and the reference voltage; wherein the comparing unit outputs another high logic level signal to the computer host when the first photosensitive circuit and the second photosensitive circuit are connected with the comparing unit as the positive logic connection and the another testing voltage is not larger than the reference voltage, while the comparing unit outputs the low logic level signal when the another testing voltage is larger than the reference voltage; or the comparing unit outputs the another high logic level signal to the computer host when the first photosensitive circuit and the second photosensitive circuit are connected with the comparing unit as the negative logic connection and the another testing voltage is not smaller than the reference voltage, while the comparing unit outputs the low logic level signal when the another testing voltage is smaller than the reference voltage.

3. The system for testing illuminating elements as claimed in claim 2, wherein the computer host comprises a testing program capable of generating the testing pass signal when the computer host receives the high logic level signal and the another high logic level signal, or generating the testing failure signal when the computer host receives the low logic level signal.

4. The system for testing illuminating elements as claimed in claim 3, further comprising a computer peripheral device, wherein the computer peripheral device is connected with the computer host, and capable of providing the testing pass signal or the testing failure signal.

5. The system for testing illuminating elements as claimed in claim 4, wherein the computer peripheral device is a computer screen capable of displaying the testing pass signal or the testing failure signal, or an audio device capable of prompting the testing pass signal and the testing failure signal with different sounds.

6. The system for testing illuminating elements as claimed in claim 1, wherein the testing socket is connected with the computer host via a RS232 interface connection cable or an universal serious bus (USB) interface connection cable, and the first photosensitive element and the second photosensitive element are photosensitive resistors.

7. The system for testing illuminating elements as claimed in claim 2, wherein the testing socket is connected with the computer host via a RS232 interface connection cable or an universal serious bus (USB) interface connection cable, and the first photosensitive element and the second photosensitive element are photosensitive resistors.

* * * * *